United States Patent
Ahn et al.

(10) Patent No.: US 8,299,450 B2
(45) Date of Patent: Oct. 30, 2012

(54) NON-VOLATILE MEMORY DEVICE INCLUDING PHASE-CHANGE MATERIAL

(75) Inventors: Dong-ho Ahn, Suwon-si (KR); Hideki Horii, Seoul (KR); Soon-oh Park, Suwon-si (KR); Young-hyun Kim, Seoul (KR); Heo-ju Shin, Yongin-si (KR); Jin-ho Oh, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 336 days.

(21) Appl. No.: 12/697,667

(22) Filed: Feb. 1, 2010

(65) Prior Publication Data
US 2011/0049459 A1    Mar. 3, 2011

(30) Foreign Application Priority Data
Aug. 27, 2009   (KR) .................. 10-2009-0079767

(51) Int. Cl.
*H01L 29/12*    (2006.01)
(52) U.S. Cl. .......... 257/2; 257/5; 257/529; 257/E29.17; 257/E29.029; 438/102; 438/103; 438/900; 365/148; 365/158; 365/159
(58) Field of Classification Search .................. 257/1, 2, 257/3, 4, 5, 529, E29.17, E29.029; 365/148, 365/158, 159; 438/102, 103, 900
See application file for complete search history.

(56) References Cited

U.S. PATENT DOCUMENTS

| | | | |
|---|---|---|---|
| 6,087,674 A | 7/2000 | Ovshinsky et al. | |
| 6,847,535 B2* | 1/2005 | Gilton et al. | 365/51 |
| 2007/0194294 A1* | 8/2007 | Song et al. | 257/5 |
| 2008/0191187 A1* | 8/2008 | Lung et al. | 257/4 |
| 2010/0182825 A1* | 7/2010 | Lowrey et al. | 365/163 |
| 2011/0012080 A1* | 1/2011 | Schell et al. | 257/2 |
| 2011/0049458 A1* | 3/2011 | Ahn et al. | 257/2 |

FOREIGN PATENT DOCUMENTS

| | | |
|---|---|---|
| KR | 1020040076225 A | 8/2004 |
| KR | 1020060013272 A | 2/2006 |
| KR | 100819560 B1 | 3/2008 |

* cited by examiner

*Primary Examiner* — Eduardo A Rodela
(74) *Attorney, Agent, or Firm* — Volentine & Whitt, PLLC

(57) ABSTRACT

A non-volatile memory device includes a lower electrode, a phase-change material layer formed on the lower electrode so as to be electrically connected to the lower electrode, and an upper electrode formed on the phase-change material layer so as to be electrically connected to the phase-change material layer. The phase-change material layer includes a phase-change material including a composition represented by the formula $(I)_A(II_X III_Y IV_Z)_{(1-A)}$, where I is at least one of As and Se, II is at least one of Ge, Si and Sn, III is at least one of Sb and Bi, and IV is at least one of Te and Se, and where $0.001 \leq A \leq 0.3$, $0.001 \leq X \leq 0.3$, $0.001 \leq Y \leq 0.8$, $0.1 \leq Z \leq 0.8$, and $X+Y+Z=1$.

16 Claims, 9 Drawing Sheets

NON-VOLATILE MEMORY DEVICE INCLUDING PHASE-CHANGE MATERIAL

CROSS-REFERENCE TO RELATED APPLICATION

A claim of priority is made to Korean Patent Application No. 10-2009-0079767, filed Aug. 27, 2009, in the Korean Intellectual Property Office, the disclosure of which is incorporated herein in its entirety by reference.

BACKGROUND

The inventive concepts described herein generally relate to memory devices, and more particularly, the inventive concepts relate to non-volatile memory devices including a phase-change material.

Phase-change random access memory (PRAM) is an example of a non-volatile memory device which retains stored data in the absence of applied power. The PRAM is characterized by the use of a phase-change material having two or more thermally programmable resistive states to store data. In particular, the relative crystallinity of the phase change material is altered by thermal treatment (e.g., joule heating) to establish different resistivities of the material. A phase-change material in a relatively crystalline state exhibits a lower resistivity than a phase-change material in a relatively amorphous state.

As with other types of non-volatile memory devices, practical application of PRAM devices is largely dependent upon the ability to operate at a relatively low operating voltage and to exhibit relatively low power consumption.

SUMMARY

According to one or more aspects of the inventive concepts, a non-volatile memory device is provide which includes a lower electrode, a phase-change material layer formed on the lower electrode so as to be electrically connected to the lower electrode, and an upper electrode formed on the phase-change material layer so as to be electrically connected to the phase-change material layer. The phase-change material layer includes a phase-change material including a composition represented by the formula $(I)_A(II_X III_Y IV_Z)_{(1-A)}$. In this formula, I is at least one of As and Se, II is at least one of Ge, Si and Sn, III is at least one of Sb and Bi, and IV is at least one of Te and Se. Further, in this formula, $0.001 \leq A \leq 0.3$, $0.001 \leq X \leq 0.3$, $0.001 \leq Y \leq 0.8$, $0.1 \leq Z \leq 0.8$, and $X+Y+Z=1$.

According to one or more other aspects of the inventive concepts, a non-volatile memory device is provided which includes a lower electrode, a phase-change material layer formed on the lower electrode so as to be electrically connected to the lower electrode, and an upper electrode formed on the phase-change material layer so as to be electrically connected to the phase-change material layer. The phase-change material layer includes a phase-change material including a composition represented by the formula $(M)_B(I)_A(II_X III_Y IV_Z)_{(1-A-B)}$. In this formula, M is a metal, I is at least one of As and Se, II is at least one of Ge, Si and Sn, III is at least one of Sb and Bi, and IV is at least one of Te and Se. Further, in this formula, $0.001 \leq A \leq 0.3$, $0.001 \leq B \leq 0.3$, $0.001 \leq X \leq 0.3$, $0.001 \leq Y \leq 0.8$, $0.1 \leq Z \leq 0.8$, and $X+Y+Z=1$.

BRIEF DESCRIPTION OF THE DRAWINGS

Exemplary embodiments of the inventive concepts will be more clearly understood from the detailed description that follows, taken in conjunction with the accompanying drawings, in which.

DETAILED DESCRIPTION OF EMBODIMENTS

Figure 1:
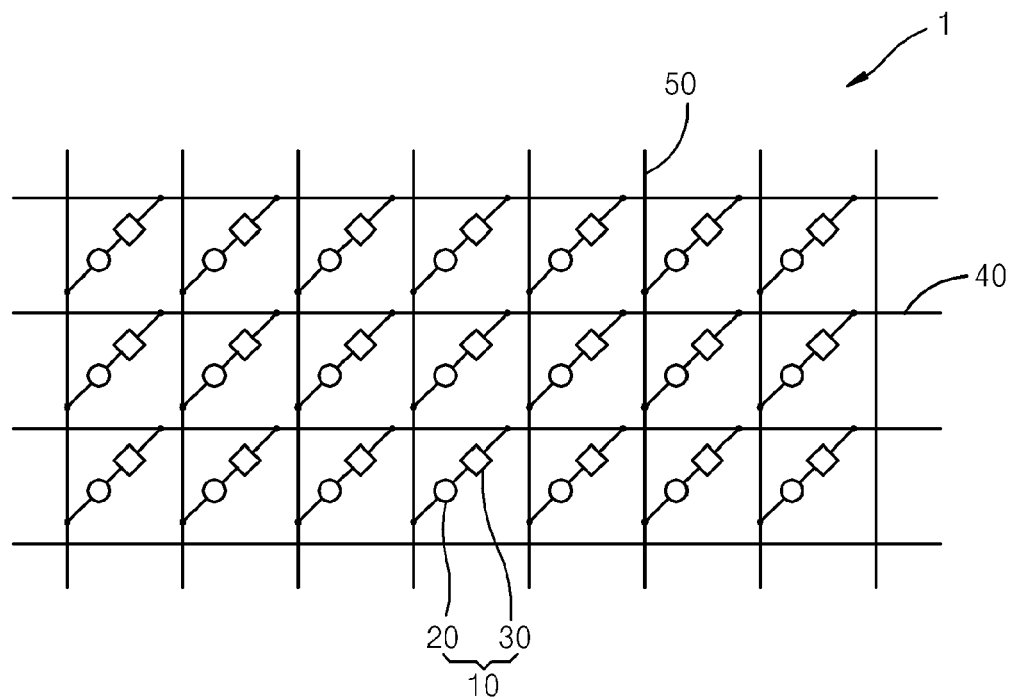
FIG. 1 is a schematic diagram of a non-volatile memory array to which embodiments of the inventive concepts may be applied.

Reference will now be made in detail to exemplary embodiments, examples of which are illustrated in the accompanying drawings. However, exemplary embodiments are not limited to the embodiments illustrated hereinafter, and the embodiments herein are rather introduced to provide easy and complete understanding of the scope and spirit of exemplary embodiments. In the drawings, the thicknesses of layers and regions are exaggerated for clarity.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Spatially relative terms, such as "above," "upper," "beneath," "below," "lower," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "above" may encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing. For example, an implanted region illustrated as a rectangle may, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes may be not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the exemplary embodiments of the inventive concept will be described in detail with reference to the accompanying drawings. In the drawings, variations from the shapes of the illustrations as a result, for example, of manufacturing techniques and/or tolerances, are to be expected. Thus, the example embodiments should not be construed as limited to the particular shapes of regions illustrated herein but may be to include deviations in shapes that result, for example, from manufacturing.

FIG. 1 is a schematic diagram of a non-volatile memory array 1 to which one or more embodiments of the inventive concepts may be applied.

Referring to FIG. 1, the non-volatile memory array 1 of this example includes unit memory cells 10 arranged in a matrix form. Each of the unit memory cells 10 includes a memory portion 20 and an access portion 30. The unit cells 10 are electrically connected to first address lines 40 and second address lines 50. The first address lines 40 and the second address lines 50 cross each other at a certain angle and are arranged two-dimensionally. The certain angle may be a right angle as shown in the figure, but other angles may be adopted.

The first address lines 40 may be one of bit lines or word lines, and the second address lines 50 may the other of bit lines or word lines.

The memory portion 20 includes a phase-change material as described later herein according to various embodiments of the inventive concepts.

The access portion 30 controls the supply of a current to the memory portion 20 in response to the voltage of the address lines 40 and/or 50. The access portion 30 may be implemented, for example, by a diode, a bipolar transistor, or a MOS transistor.

Figure 2:
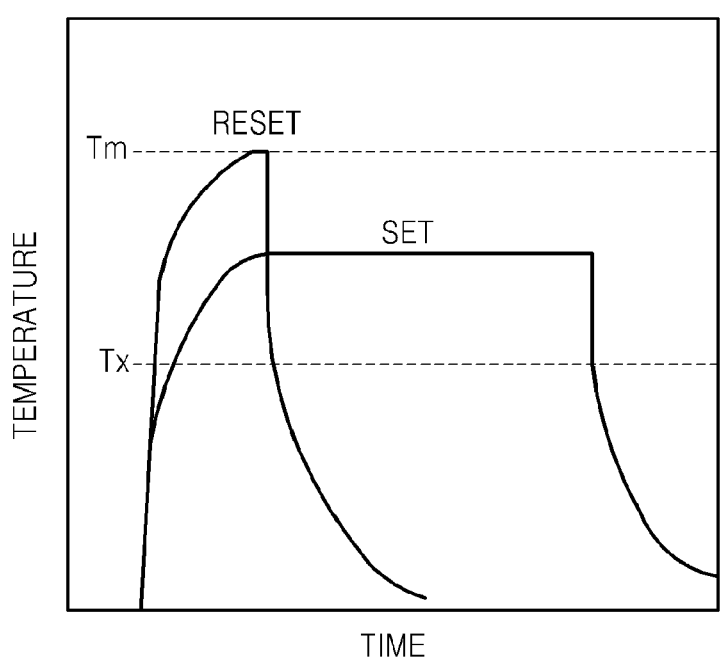
FIG. 2 is a graph for explaining programming of a phase-change material layer.

FIG. 2 is a graph for explaining a method of performing a set or reset programming operation of a phase-change material layer included in a non-volatile memory device.

Referring to FIG. 2, when the phase-change material layer is heated to a temperature between a crystallization temperature Tx and a melting point Tm, maintained at this temperature for a certain period of time, and then slowly cooled, the phase-change material layer enters into a crystalline state. The crystalline state is referred to as a set state, representing a stored data value '0'. On the other hand, when the phase-change material layer is heated to a temperature equal to or greater than the melting point Tm, and then rapidly cooled, the phase-change material layer enters into an amorphous state. The amorphous state is referred to as a reset state, representing a stored data value '1'. The stored data value may then be read by determining a resistance of the phase-change material layer.

During programming, the heating temperature of the phase-change material is generally proportional to the amount of write current flowing through the phase-change material layer. As the amount of the write current and power consumption increases, it generally becomes more difficult to achieve high integration. Since transformation into the amorphous state (reset state) requires more current than transformation into the crystalline state (set state), power consumption of the memory device is significantly dependent upon reset programming. Accordingly, achieving a high degree of device integration is at least partly dependent upon reducing the current required for transformation into the amorphous state (that is, a reset current).

It should be pointed out that programming of "multi-bit" phase-change memory cells is also encompassed by the inventive concepts described herein. In this case, the phase-change material is programmed into four or more different relative crystalline/amorphous states, thus providing four or more possible resistive states. In this manner, two or more bits of data may be stored in each cell.

As described above in connection with FIG. 1, a non-volatile memory device including a phase-change material layer generally includes a plurality of unit cells each including an access portion and a memory portion including a phase-change material. From a structural standpoint, each cell generally includes a phase-change material layer disposed between a lower electrode and an upper electrode, and the access portion is electrically connected to the lower electrode. As described above in connection with FIG. 2, the phase-change material layer is heated to a temperature between a crystallization temperature and a melting point, or to a temperature equal to or greater than the melting point, dependent upon the amount of write current flowing in the lower electrode and the access portion. The current causes joule heat to be generated at an interface between the lower electrode and the phase-change material layer, and the amount joule heat is dependent upon the amount of the write current.

Figure 3:
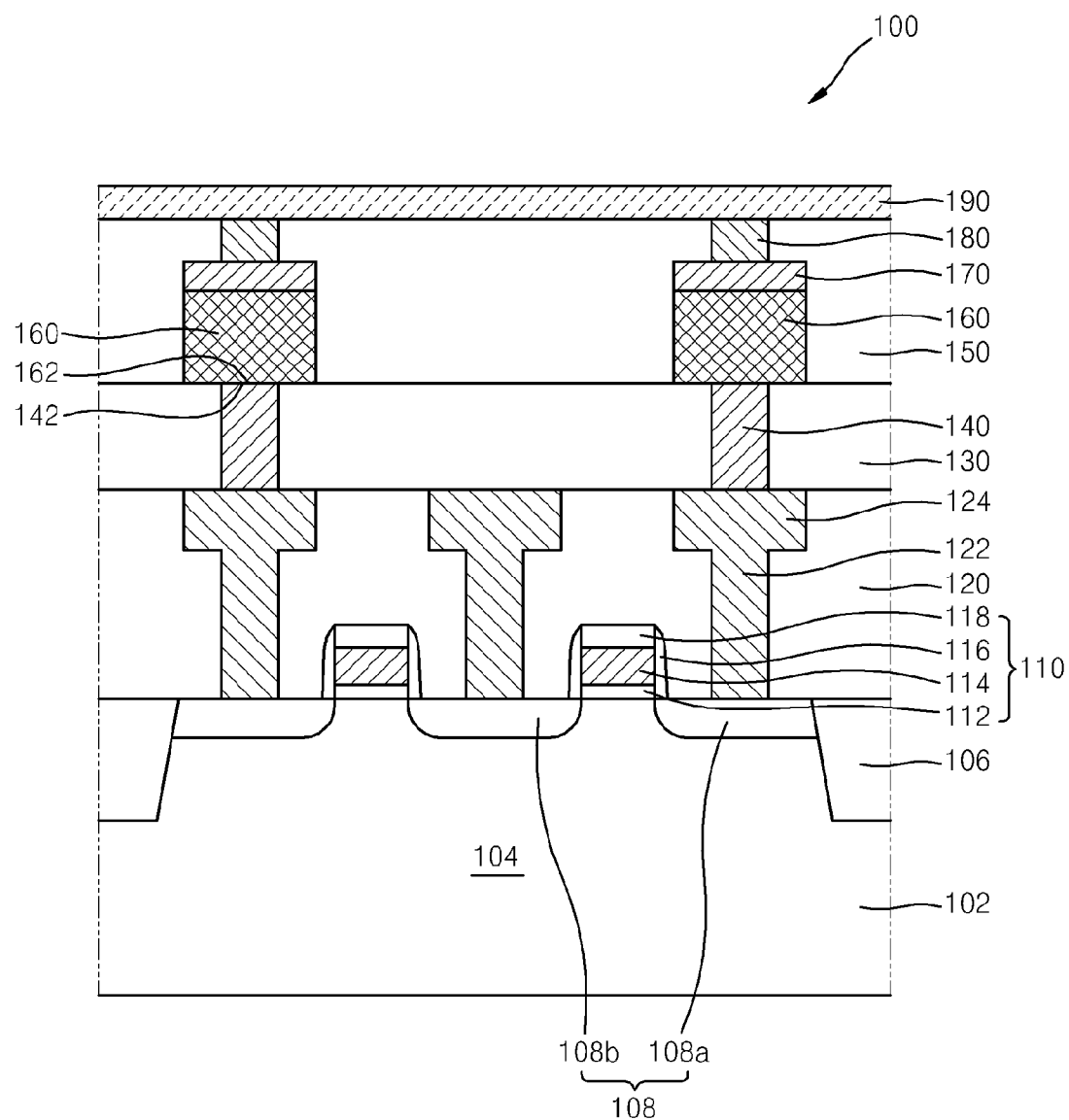
FIG. 3 is a cross-sectional view of a non-volatile memory device including a phase-change material according to embodiments of the inventive concepts.

FIG. 3 is a cross-sectional view of a non-volatile memory device 100 including a phase-change material according to embodiments of the inventive concepts.

Referring to FIG. 3, the non-volatile memory device 100 of this example includes a gate structure 110, a lower electrode 140, a phase-change material layer 160, and an upper electrode 170 which are disposed on a substrate 102. In the present example, the memory portion 20 of FIG. 1 corresponds to a structure including the lower electrode 140, the phase-change material layer 160, and the upper electrode 170, and the access portion 30 of FIG. 1 corresponds to the gate structure 110.

The substrate 102 may include an isolation film 106 that defines an active region 104. The substrate 102 may further include a dielectric layer including, for example, silicon (Si) oxide, titanium (Ti) oxide, aluminum (Al) oxide, zirconium (Zr) oxide, or hafnium (Hf) oxide, a conductive layer including Ti, Ti nitride (TiN), Al, tantalum (Ta), Ta nitride (TaN), and/or Ti Al nitride (TiAlN), or a semiconductor layer including Si, Si-germanium (SiGe), and/or Si carbide (SiC). The substrate 102 may also include at least one of the group consisting of an epitaxial layer, a silicon-on-insulator (SOI) layer, and a semiconductor-on-insulator (SEOI) layer. Although not shown in the drawings, the substrate 102 may further include a word line (not shown), a bit line (not shown), and/or other semiconductor devices. The isolation film 106 may be formed by shallow trench isolation (STI). An impurity region 108 is included in the active region 104. Although not shown in the drawings, the impurity region 108 may include a low-concentration impurity region disposed adjacent to the gate structure 110 and a high-concentration impurity region disposed relatively far from the gate structure 110. The impurity region 108 may serve as a source/drain region. For example, the impurity region 108 may include a source region 108a and a drain region 108b. The gate structure 110 is formed on the active region 104. The gate structure 110 includes a gate insulation layer 112, a gate electrode layer 114, a spacer 116, and a capping layer 118. The gate structure 110, the source region 108a, and the drain region 108b may form a MOS transistor, which serves as an access device. This structure is only an example, and the inventive concepts are not limited thereto. In other words, the gate structure 110 (MOS transistor) may be replaced with a diode or a bipolar transistor.

A first interlayer insulation layer 120 covering the gate structure 110 is formed on the substrate 102. The first interlayer insulation layer 120 may include at least one selected from the group consisting of Si oxide and Si oxynitride. The first interlayer insulation layer 120 includes a first contact plug 122 which is electrically connected to the impurity region 106. In other words, the first contact plug 122 is electrically connected to the source region 108a or to the drain region 108b. As illustrated in FIG. 3, the first contact plug 122 may have an extension region 124 thereon, and the extension region 124 may increase the electrical contact area between the first contact plug 122 and the lower electrode 140. The first contact plug 122 may include at least one selected from the group consisting of, for example, Ti, TiN, tungsten (W), and W nitride (WN). The first contact plug 122 may have a stacked structure of the above-listed materials. The first contact plug 122 may be a single layer including one of the above-listed materials, a single layer including a plurality of materials selected from the above-listed materials, a multi-layer structure including multiple layers each including one selected from the above-listed materials, or a multi-layer structure including multiple layers each including a plurality of materials selected from the above-listed materials.

A second interlayer insulation layer 130 is formed on the first interlayer insulation layer 120. The second interlayer insulation layer 130 may include at least one selected from the group consisting of Si oxide, Si nitride, and Si oxynitride.

The lower electrode 140 is formed in the second interlayer insulation layer 130. The lower electrode 140 is formed on the first contact plug 122 and/or on the extension region 124 and is electrically connected to the first contact plug 122. Accordingly, the lower electrode 140 is electrically connected to the gate structure 110 through the first contact plug 122 and the drain region 108b. The lower electrode 140 and the first contact plug 122 may be integrally formed as a one-piece body. The lower electrode 140 may be formed using an etching method, a damascene method, or a dual damascene method. The lower electrode 140 may include metal, for example, Al, Cu, W, Ti, or Ta, an alloy such as TiW or TiAl, or carbon (C). The lower electrode 140 may include at least one of TiN, TiAlN, Ta TaN, WN, molybdenum (Mo) nitride (MoN), niobium (Nb) nitride (NbN), TiSiN, Ti boron nitride (TiBN), ZrSiN, WSiN, WBN, ZrAlN, MoAlN, TaSiN, TaAlN, Ti oxynitride (TiON), TiAlON, WON, TaON, Ti carbonitride (TiCN), and/or TaCN. The lower electrode 140 may be a single layer including one of the above-listed materials, a single layer including a plurality of materials selected from the above-listed materials, a multi-layer structure including multiple layers each including one of the above-listed materials, or a multi-layer structure including multiple layers each including a plurality of materials selected from the above-listed materials. The lower electrode 140 may have a shape of an extended line or an array of a plurality of polyhedrons. Alternatively, the lower electrode 140 may have a ring shape filled with a material different from the lower electrode 140, for example, with an insulator. Although not shown in the drawings, an etching stop layer (not shown) may be optionally formed on the lower electrode 140. The etching stop layer may include, for example, Si oxynitride (SiON), Hf oxide (HfO), or Al oxide ($Al_2O_3$). The etching stop layer may prevent the lower electrode 140 from being damaged by etching and the like performed in subsequent processes.

A third interlayer insulation layer 150 is formed on the second interlayer insulation layer 130. The third interlayer insulation layer 150 may include at least one selected from the group consisting of Si oxide, Si nitride, and Si oxynitride.

The phase-change material layer 160 is formed in the third interlayer insulation layer 150. The phase-change material layer 160 is formed on the lower electrode 140 and electrically connected to the lower electrode 140. The phase-change material layer 160 may be formed by sputtering, chemical vapor deposition (CVD), plasma enhanced CVD (PECVD), atomic layer deposition (ALD), or the like. Although not shown in the drawings, a seed layer (not shown) may be further formed optionally between the lower electrode 140 and the phase-change material layer 160, and the seed layer facilitates the formation of the phase-change material layer 160. The area of a bottom surface 162 of the phase-change material layer 160 may be greater than that of a top surface 142 of the lower electrode 140. Accordingly, the crystalline status of a portion of the bottom surface 162 of the phase-change material layer 160 may be changed by the lower electrode 140. The above-described configuration of phase-change material layer 160 is only an example, and the inventive concepts are not limited thereto. Other examples are presented later herein with reference to FIGS. 4 through 6. The phase-change material layer 160 may include a phase-change material capable of storing data according to different crystalline status as described above, for example, chalcogenide, and may further include metal. The phase-change material layer 160 may be doped with at least one selected from the group consisting of C, nitrogen (N), Si, oxygen (O), bismuth (Bi), and tin (Sn). A driving current of the non-volatile memory device 100 may be reduced due to this doping. The phase-change material included in the phase-change material layer 160 will be described in greater detail with reference to FIG. 7.

The upper electrode 170 is formed on the phase-change material layer 160 and is electrically connected to the phase-change material layer 160. The upper electrode 170 may include metal, for example, Al, Cu, W, Ti, or Ta, or an alloy, for example, TiW or TiAl, or C. The upper electrode 170 may include at least one of TiN, TiAlN, Ta TaN, WN, MoN, NbN, TiSiN, TiBN, ZrSiN, WSiN, WBN, ZrAlN, MoAlN, TaSiN, TaAlN, TiON, TiAlON, WON, TaON, TiCN, and/or TaCN. The upper electrode 170 may be a single layer including one of the above-listed materials, a single layer including a plurality of materials selected from the above-listed materials, a multi-layer structure including multiple layers each including one of the above-listed materials, or a multi-layer structure including multiple layers each including a plurality of materials selected from the above-listed materials. The lower electrode 140 and the upper electrode 170 may be formed of an identical material or may be formed of different materials.

A second contact plug 180 is formed on the upper electrode 170 and is electrically connected to the upper electrode 170. The second contact plug 180 may include at least one selected from the group consisting of Ti, TiN, W, and WN. The second contact plug 180 may have a stacked structure of the above-listed materials. The second contact plug 180 may be a single layer including one of the above-listed materials, a single layer including a plurality of materials selected from the above-listed materials, a multi-layer structure including multiple layers each including one of the above-listed materials, or a multi-layer structure including multiple layers each including a plurality of materials selected from the above-listed materials. The upper electrode 170 and the second contact plug 180 may be integrally formed as a one-piece body. An upper wiring 190 is formed on the second contact plug 180, and the second contact plug 180 is electrically connected to the upper wiring 190.

As described above, the first interlayer insulation layer 120, the first contact plug 122, the second interlayer insulation layer 130, the lower electrode 140, the third interlayer insulation layer 150, the phase-change material layer 160, the upper electrode 170, the second contact plug 180, and the upper wiring 190 may be formed by sputtering, CVD, PECVD, ALD, or the like. The layers may be formed by using a photolithographic method, an etching method, a planarization method such as chemical mechanical polishing (CMP) or dry etching.

Figure 4:
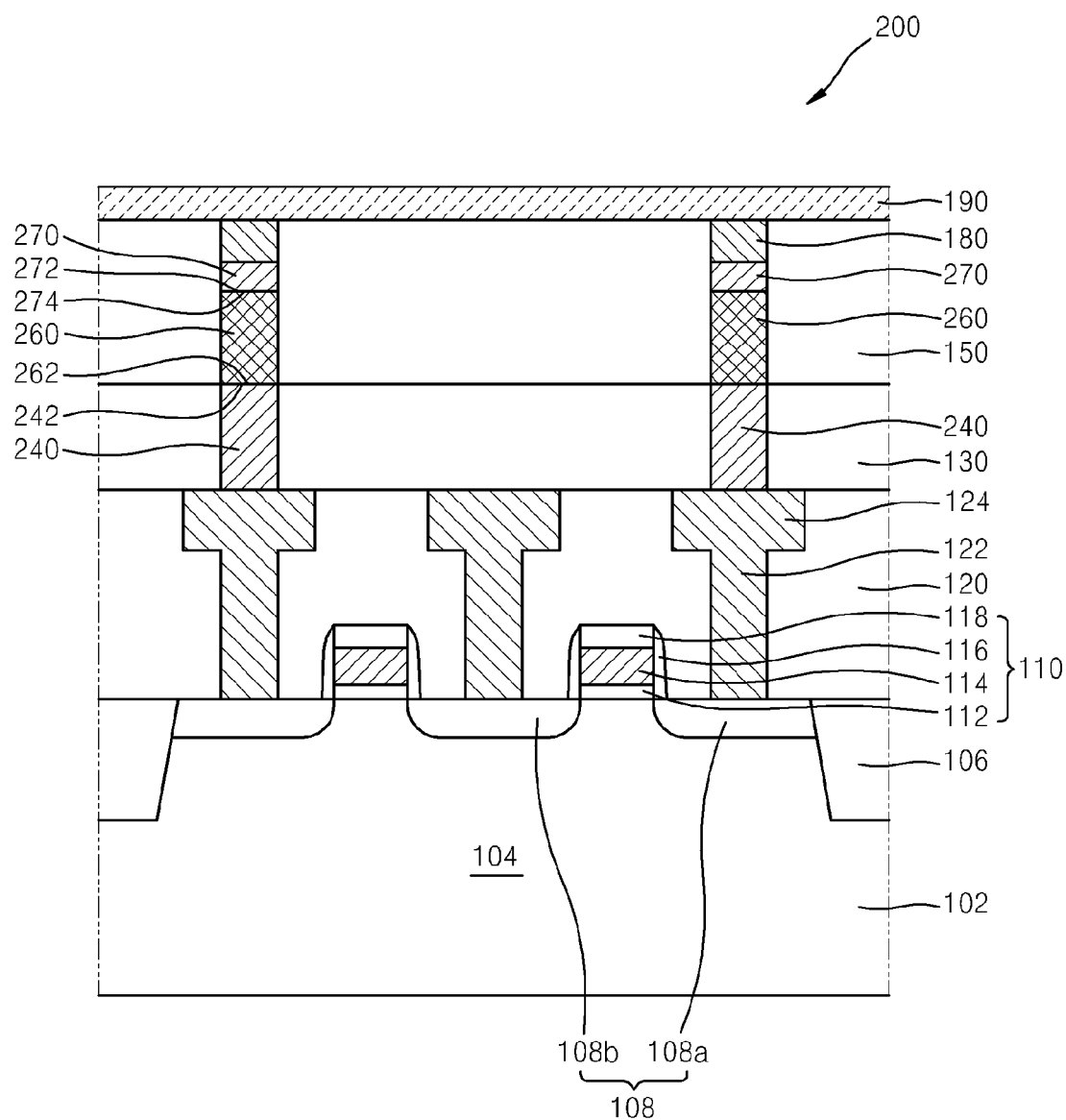
FIGS. 4 through 6 are cross-sectional views of non-volatile memory devices including a phase-change material according to embodiments of the inventive concepts.
Figure 5:
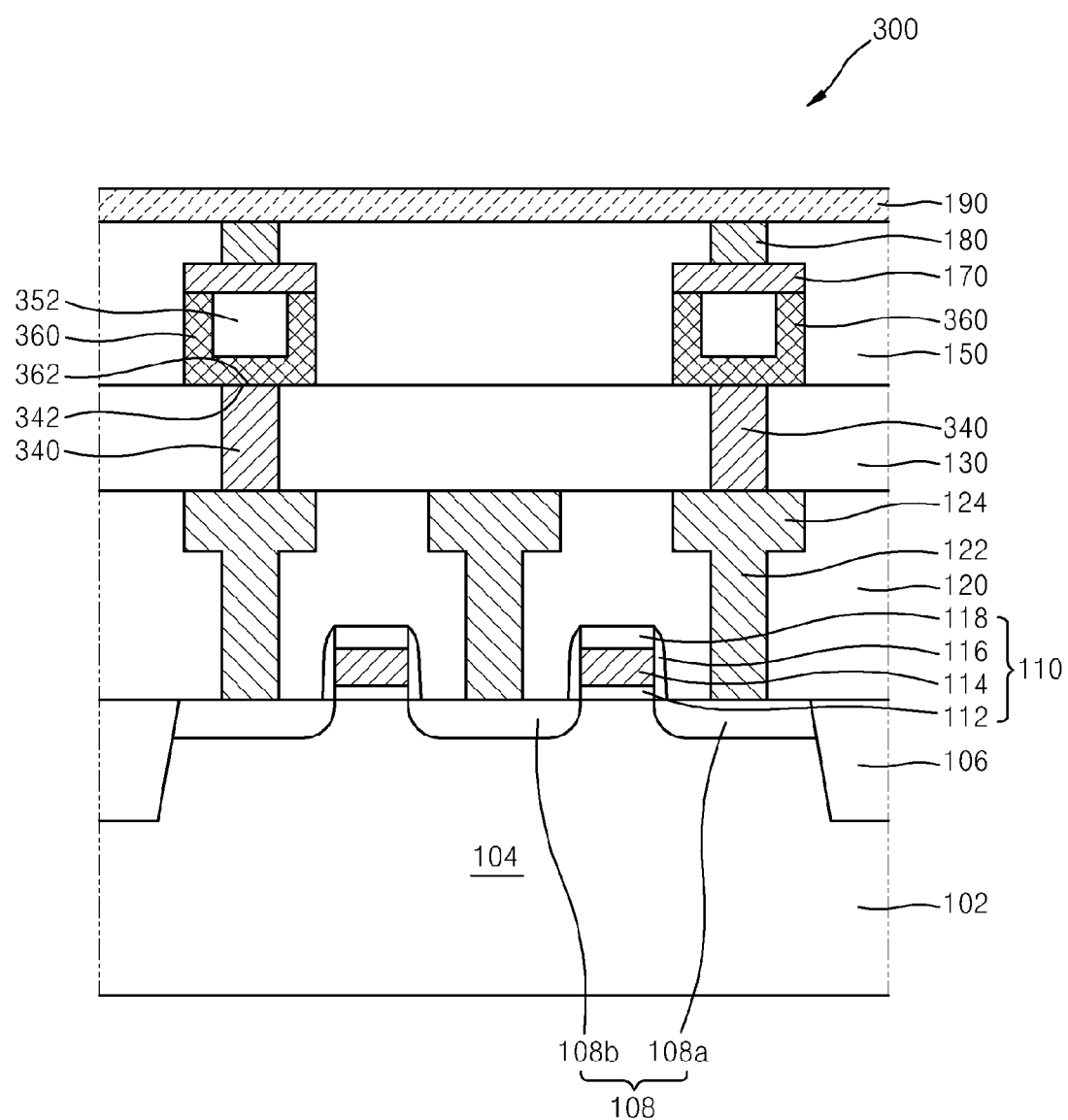
Figure 6:
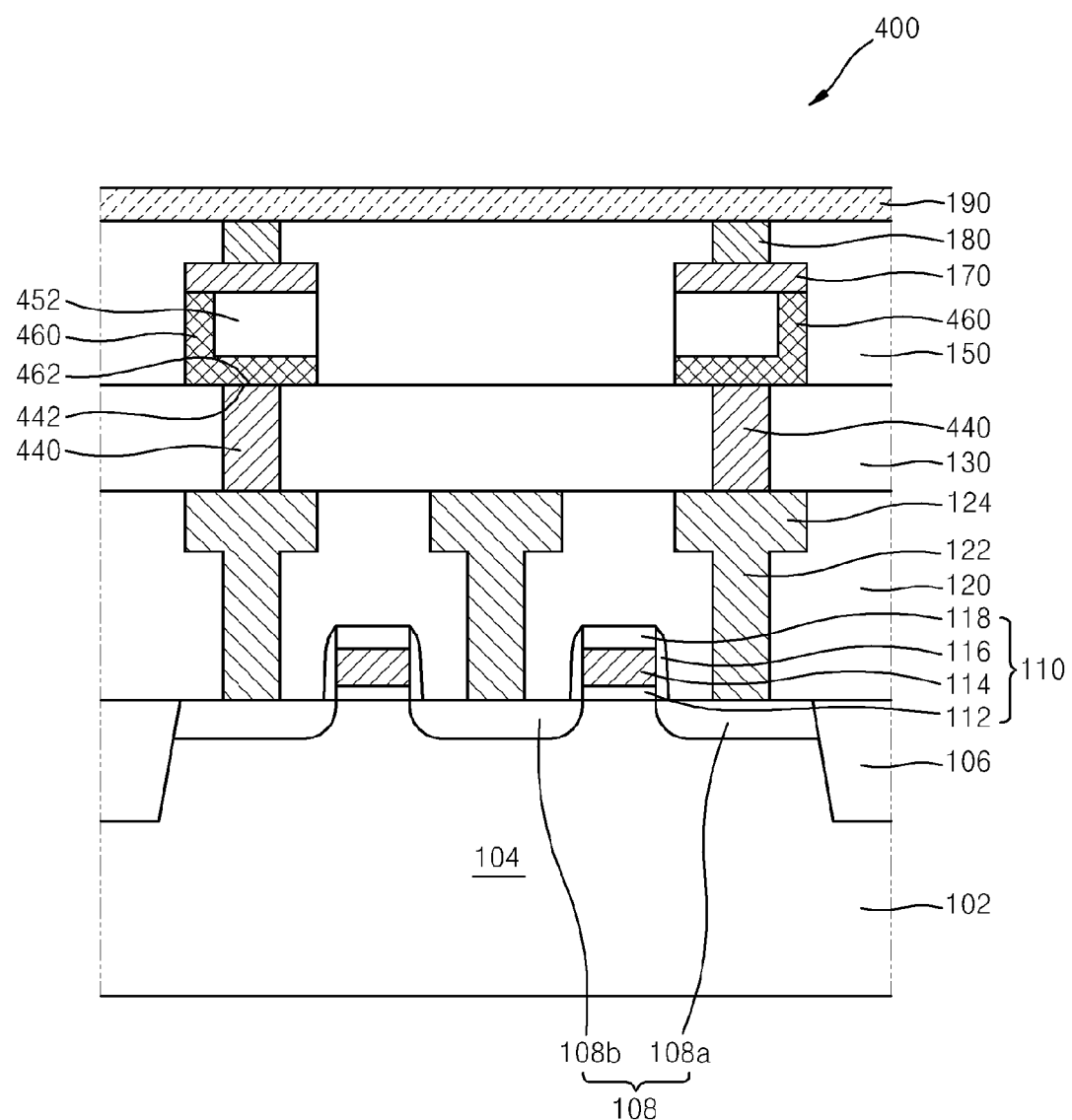

FIGS. 4 through 6 are cross-sectional views of non-volatile memory devices 200, 300, and 400 including a phase-change material according to embodiments of the inventive concepts. A detailed description of elements that are substantially the same as or equivalent to those in previously described FIG. 3 is omitted below to avoid redundancy.

Referring to the example of FIG. 4, the area of a bottom surface 262 of a phase-change material layer 260 may be substantially the same as that of a top surface 242 of a lower electrode 240. Accordingly, the crystalline status of the entire bottom surface 262 of the phase-change material layer 260 may be changed by the lower electrode 240. The area of a top surface 264 of the phase-change material layer 260 may be substantially the same as that of a bottom surface 272 of an upper electrode 270.

Referring to the example of FIG. 5, a phase-change material layer 360 may include a first inner insulation layer 352. The phase-change material layer 360 may have a "U"-typed cross section structure that covers both side surfaces and the bottom surface of the first inner insulation layer 352. As in the embodiment illustrated in FIG. 3, the area of a bottom surface 362 of the phase-change material layer 360 may be greater than that of a top surface 342 of a lower electrode 340. Alternatively, as in the embodiment illustrated in FIG. 4, the area of the bottom surface 362 of the phase-change material layer 360 may be substantially the same as that of the top surface 342 of the lower electrode 340. The first inner insulation layer 352 may include at least one selected from the group consisting of Si oxide, Si nitride, and Si oxynitride. Although not shown in the drawings, a lining layer (not shown) may be optionally formed between the phase-change material layer 360 and the first inner insulation layer 352. The lining layer may include, for example, Si nitride (SiN). The lining layer may prevent the phase-change material layer 360 from being damaged by etching and the like performed in subsequent processes.

Referring to the example of FIG. 6, a phase-change material layer 460 may include a second inner insulation layer 452. The phase-change material layer 460 may have a "L"-typed cross section structure that covers one side surface and a bottom surface of the second inner insulation layer 452. As in the embodiment illustrated in FIG. 3, the area of a bottom surface 462 of the phase-change material layer 460 may be greater than that of a top surface 442 of a lower electrode 440. Alternatively, as in the embodiment illustrated in FIG. 4, the area of the bottom surface 462 of the phase-change material layer 460 may be substantially the same as that of the top surface 442 of the lower electrode 440. The second inner insulation layer 452 may include at least one selected from the group consisting of Si oxide, Si nitride, and Si oxynitride. Although not shown in the drawings, a lining layer (not shown) may be optionally formed between the phase-change material layer 460 and the second inner insulation layer 452. The lining layer may include, for example, SiN. The lining layer may prevent the phase-change material layer 460 from being damaged by etching and the like performed in subsequent processes.

A phase-change material used to form the phase-change material layers 160, 260, 360, and 460 included in the non-volatile memory devices 100, 200, 300, and 400, respectively, will now be described. However, the structural configurations of FIGS. 3-6 are merely presented as examples of devices containing phase-change materials of embodiments of the inventive concepts, and the compositions of the phase-change materials described below are not limited to the configurations of FIGS. 3-6.

The phase-change material layers 160, 260, 360, and 460 include a material capable of storing data according to different crystalline status as described above, for example, a phase-change material such as chalcogenide. In addition, the phase-change material may further include a metal. The phase-change material layers 160, 260, 360, and 460 may also be doped, for example, with at least one selected from the group consisting of C, N, Si, O, Bi, and Sn, which may be effective in reducing a driving current of the memory devices 100, 200, 300, and 400.

As will be explained below in the form of specific examples, the phase-change material layer of embodiments of the inventive concepts includes a phase-change material including a composition represented by the Formula PC1 as follows:

$$(I)_A(II_XIII_YIV_Z)_{(1-A)},\quad \text{Formula PC1}$$

where I is at least one of As and Se, II is at least one of Ge, Si and Sn, III is at least one of Sb and Bi, and IV is at least one of Te and Se, and where $0.001 \leq A \leq 0.3$, $0.001 \leq X \leq 0.3$, $0.001 \leq Y \leq 0.8$, $0.1 \leq Z \leq 0.8$, and $X+Y+Z=1$.

Figure 7:
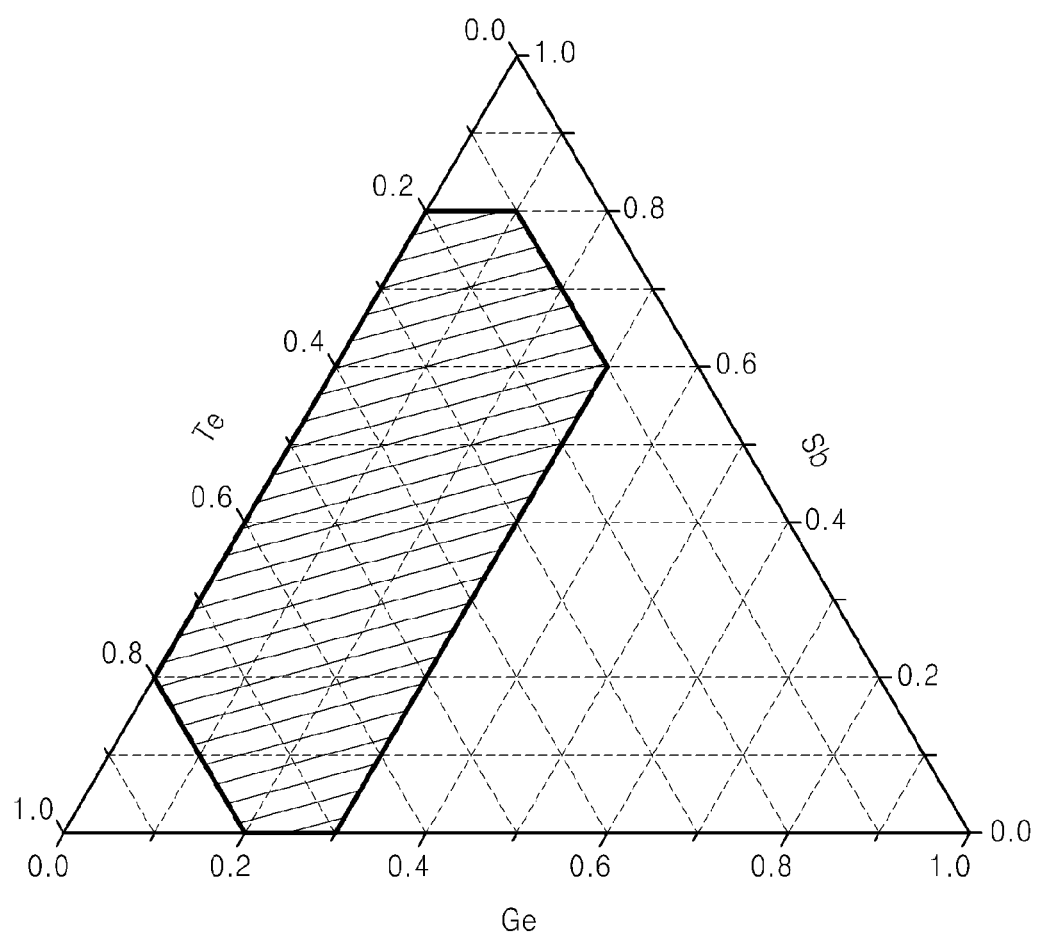
FIG. 7 is a ternary phase diagram illustrating composition ratios of a phase-change layer included in the non-volatile memory devices illustrated in FIGS. 3 through 6 according to embodiments of the inventive concepts.

FIG. 7 is a ternary phase diagram illustrating an exemplary composition ratio of a phase-change material of embodiments the inventive concepts used to form the phase-change material layers 160, 260, 360, and 460 of the non-volatile memory devices 100, 200, 300, and 400 illustrated in FIGS. 3 through 6. In the example of these embodiments represented by FIG. 7, the phase-change material includes Ge, antimony (Sb), and tellurium (Te). Although not shown in FIG. 7, the phase-change material of this example also includes arsenic (As) and/or selenium (Se). For example, in the case where As is included, the phase-change material may have a composition represented by Formula 1 below. It will be understood that the variables A, X, Y and Z denote atomic ratios.

$$(As)_A(Ge_X Sb_Y Te_Z)_{(1-A)}\quad \text{Formula 1}$$

where $0.001 \leq A \leq 0.3$, $0.001 \leq X \leq 0.3$, $0.001 \leq Y \leq 0.8$, $0.1 \leq Z \leq 0.8$, and $(X+Y+Z)=1$.

Thus, according to the example of Formula 1 and FIG. 7, the phase-change material of the phase-change material layers 160, 260, 360, and 460 includes Ge, Sb, and Te (GST), and in particular, the Ge among the GST has an atomic ratio of 0.001 to 0.3, the Sb among the GST has an atomic ratio of 0.001 to 0.8, and the Te among the GST has an atomic ratio of 0.001 to 0.8. The phase-change material of this example further includes As in an atomic ratio of 0.001 to 0.3 relative to the GST. In this case, the atomic ratio of the Ge—Sb—Te (GST) ternary material to the entire composition of the phase-change material is 0.999 to 0.7. A Ge—Sb—Te ternary material forms various solid solutions or an intermetallic compound. For example, Ge and Sb may have a eutectic system over the entire composition range, but do not form an intermetallic compound having a fixed formula amount. Ge and Te may form an intermetallic compound of GeTe having a melting point of about 725° C. Sb and Te may form solid solutions expressed by α, β, γ, and δ and an intermetallic compound of $Sb_2Te_3$ having a melting point of about 620° C., as the content of Te increases. In the example where the phase-change material includes As, the As and Ge may form an intermetallic compound of GeAs having a melting point of about 737° C., in which the content of As is about 40% to about 60% with respect to Ge, and form an intermetallic compound of $GeAs_2$ having a melting point of about 732° C., in which the content of As is about 60% to about 80% with respect to Ge. As and Sb may have a eutectic system over the entire composition range, but do not form an intermetallic compound having a fixed formula amount. As and Te may form an intermetallic compound of $As_2Te_3$ having a melting point of about 380° C.

For example, if the atomic ratio of Ge exceeds 0.3, the time and current required for a set operation may increase or a set voltage may rapidly increase. On the other hand, if the atomic ratio of Ge is less than 0.01, a reset resistance increase may not be sufficiently large and retention characteristics may be degraded. If the atomic ratio of Sb exceeds 0.8, the number of rewrite operations that may be performed may decrease, or the current required for a reset operation may increase, or retention characteristics may be degraded. If the atomic ratio of Sb is less than 0.01, the thermal resistance characteristics of the phase-change material layer 160, 260, 360, and 460 may significantly decrease, or sublimation of the phase change material may increase during manufacturing of the memory device. If the atomic ratio of Te exceeds 0.8, the retention characteristics may deteriorate due to instability of the non-volatile memory device under high resistivity. If the atomic ratio of Te is less than 0.01, phase separation progresses during operation of the non-volatile memory device, and the reliability of the reset operation may deteriorate.

At least a portion of each of the As, Ge, Sb, and Te included in the phase-change material of Formula 1 used to form the phase-change material layers 160, 260, 360, and 460 may be replaced by another material. The type of replacement material may depend on the desired characteristics of the memory device. For example, indium (In), Si, As, and Se reinforce amorphization of a phase-change material. On the other hand, Sn and Bi reinforce crystallization of a phase-change material.

For example, according to embodiments of the inventive concepts, a portion or all of the As included in the phase-change material, of which composition is expressed in Formula 1, is replaced with Se, and thus the phase-change material has a composition represented by Formula 2 as follows.

$$(As_C Se_{(1-C)})_A(Ge_X Sb_Y Te_Z)_{(1-A)}\quad \text{Formula 2}$$

where $0.001 \leq A \leq 0.3$, $0 \leq C \leq 1$, $0.001 \leq X \leq 0.3$, $0.001 \leq Y \leq 0.8$, $0.1 \leq Z \leq 0.8$, and $X+Y+Z=1$.

As another example, according to embodiments of the inventive concepts, a portion or all of the Ge included in the phase-change material, of which composition is expressed in Formula 1, is replaced with Si, Sn, or both, and thus the phase-change material has a composition represented by Formula 3 as follows.

$$(As)_A((Ge_U Q_{(1-U)})_X Sb_Y Te_Z)_{(1-A)}\quad \text{Formula 3}$$

where $0.001 \leq A \leq 0.3$, $0.001 \leq X \leq 0.3$, $0.001 \leq Y \leq 0.8$, $0.1 \leq Z \leq 0.8$, $X+Y+Z=1$, Q is Si or Sn, and $0 \leq U \leq 1$.

As yet another example, according to embodiments of the inventive concept, a portion or all of the Sb included in the phase-change material, of which composition is expressed in Formula 1, is replaced with Bi, and thus the phase-change material has a composition represented by Formula 4 as follows.

$$(As)_A(Ge_X((Sb_V Bi_{(1-V)})_Y Te_Z)_{(1-A)}\quad \text{Formula 4}$$

where $0.001 \leq A \leq 0.3$, $0.001 \leq X \leq 0.3$, $0.001 \leq Y \leq 0.8$, $0.1 \leq Z \leq 0.8$, $X+Y+Z=1$, and $0 \leq V \leq 1$.

As still another example, according to embodiments of the inventive concepts, a portion or all of the Te included in the phase-change material, of which composition is expressed in Formula 1, is replaced with Se, and thus the phase-change material has a composition represented by Formula 5 as follows.

$$(As)_A(Ge_X Sb_Y(Te_W Se_{(1-W)})_Z)_{(1-A)}\quad \text{Formula 5}$$

where $0.001 \leq A \leq 0.3$, $0.001 \leq X \leq 0.3$, $0.001 \leq Y \leq 0.8$, $0.1 \leq Z \leq 0.8$, $X+Y+Z=1$, and $0 \leq W \leq 1$.

As another example, according to embodiments of the inventive concepts, a portion or all of the Ge included in the phase-change material, of which composition is expressed in Formula 1, is replaced with Si, Sn, or both, and a portion or all of the Sb included in the phase-change material is replaced with Bi, and thus the phase-change material has a composition represented by Formula 6 as follows.

$$(As)_A((Ge_U Q_{(1-U)})_X(Sb_V Bi_{(1-V)})_Y Te_Z)_{(1-A)}\quad \text{Formula 6}$$

where $0.001 \leq A \leq 0.3$, $0.001 \leq X \leq 0.3$, $0.001 \leq Y \leq 0.8$, $0.1 \leq Z \leq 0.8$, $X+Y+Z=1$, Q is Si or Sn, $0 \leq U \leq 1$, and $0 \leq V \leq 1$.

As another example, according to embodiments of the inventive concepts, a portion or all of the Sb included in the phase-change material, of which composition is expressed in Formula 1, is replaced with Bi, and a portion or all of the Te included in the phase-change material is replaced with Se, and thus the phase-change material has a composition represented by Formula 7 as follows.

$$(As)_A(Ge_X(Sb_YBi_{(1-V)})_Y(Te_WSe_{(1-W)})_Z)_{(1-A)} \quad \text{Formula 7}$$

where $0.001 \leq A \leq 0.3$, $0.001 \leq X \leq 0.3$, $0.001 \leq Y \leq 0.8$, $0.1 \leq Z \leq 0.8$, $X+Y+Z=1$, $0 \leq V \leq 1$, and $0 \leq W \leq 1$.

As yet another example, according to embodiments of the inventive concepts, a portion or all of the Ge included in the phase-change material, of which composition is expressed in Formula 1, is replaced with Si, Sn, or both, and a portion or all of the Te included in the phase-change material is replaced with Se, and thus the phase-change material has a composition represented by Formula 8 as follows.

$$(As)_A((Ge_UQ_{(1-U)})_XSb_Y(Te_WSe_{(1-W)})_Z)_{(1-A)} \quad \text{Formula 8}$$

where $0.001 \leq A \leq 0.3$, $0.001 \leq X \leq 0.3$, $0.001 \leq Y \leq 0.8$, $0.1 \leq Z \leq 0.8$, $X+Y+Z=1$, Q is Si or Sn, $0 \leq U \leq 1$, and $0 \leq W \leq 1$.

According to other embodiments of the inventive concept, the phase-change material may further include a metal. In this case, the phase-change material layer of embodiments of the inventive concepts includes a phase-change material including a composition represented by the Formula PC2 as follows:

$$(M)_B(I)_A(II_XIII_YIV_Z)_{(1-A)}, \quad \text{Formula PC2}$$

where M is a metal, I is at least one of As and Se, II is at least one of Ge, Si and Sn, III is at least one of Sb and Bi, and IV is at least one of Te and Se, and where $0.001 \leq A \leq 0.3$, $0.001 \leq B \leq 0.3$, $0.001 \leq X \leq 0.3$, $0.001 \leq Y \leq 0.8$, $0.1 \leq Z \leq 0.8$, and $X+Y+Z=1$.

In one specific example, the phase-change material includes a composition represented by Formula 9 as follows.

$$(M)_B(As)_A(Ge_XSb_YTe_Z)_{(1-A-B)} \quad \text{Formula 9}$$

where M is metal, $0.001 \leq A \leq 0.3$, $0.001 \leq B \leq 0.3$, $0.001 \leq X \leq 0.3$, $0.001 \leq Y \leq 0.8$, $0.1 \leq Z \leq 0.8$, and $X+Y+Z=1$.

The metal (M) may, for example, include a transition metal. The metal may, for example, include at least one selected from the group consisting of aluminum (Al), gallium (Ga), zinc (Zn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), palladium (Pd), and polonium (Po). These metal materials may increase electrical conductivity and thermal conductivity of the phase-change material layers 160, 260, 360, and 460. Thus, a crystallization speed may be increased, and thus a set speed may be increased. In addition, data retention characteristics may be improved.

In Formula 9, as described above with reference to Formulae 2 through 8, a portion or all of the As included in the phase-change material may be replaced with Se, and/or a portion or all of the Ge included in the phase-change material may be replaced with Si, Sn, or both of them, and/or a portion or all of the Sb included in the phase-change material may be replaced with Bi, and/or a portion or all of the Te included in the phase-change material may be replaced with Se.

The above-described materials used to form the phase-change material layers 160, 260, 360, and 460, for example, As or Se, may be included in the phase-change material layers 160, 260, 360, and 460 by sputtering, CVD, ALD, ion implantation doping, or diffusion doping. Each of the phase-change material layers 160, 260, 360, and 460 may entirely have a uniform composition or may have a multi-layer structure having different compositions. For example, at least one of the materials used to form the multi-layer structure may have a graded concentration. For example, in the graded concentration, the concentration of Sn may increase or decrease in a depth direction of the phase-change material layers 160, 260, 360, and 460.

FIGS. 8A through 8D are graphs showing characteristics of conventional non-volatile memory devices, and characteristics of non-volatile memory devices including Ge—Sb—Te phase-change materials according to embodiments of the inventive concepts.

Figure 8A:
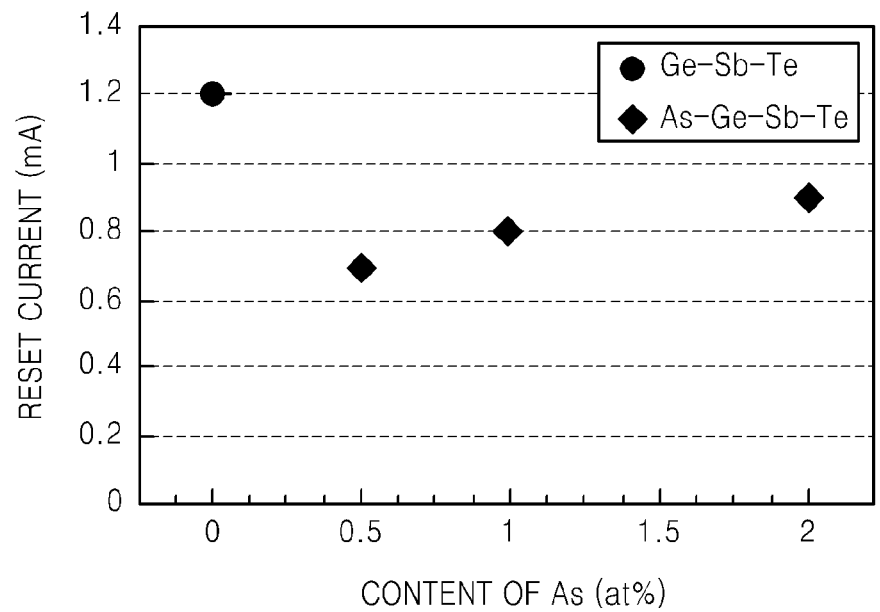
FIGS. 8A through 8D are graphs showing characteristics of a non-volatile memory device including a Ge—Sb—Te phase-change material according to embodiments of the inventive concepts.

FIG. 8A illustrates a reset current (mA) of a conventional non-volatile memory include a Ge—Sb—Te phase change material (0 at % of As), and reset currents (mA) of As—Ge—Sb—Te phase change materials (0.5%, 1% and 2% of As) according to non-volatile memory devices of embodiments of the inventive concepts. As shown in the figure, the conventional non-volatile memory device including a Ge—Sb—Te phase-change material has a reset current of about 1.2 mA, whereas the reset current is less for non-volatile memory devices using a As—Ge—Sb—Te phase-change material according to embodiments of the inventive concepts decreases. In particular, if the content of As is 0.5%, the reset current of the non-volatile memory device is 0.7 mA. If the content of As is 1%, the reset current of the non-volatile memory device is 0.8 mA. If the content of As is 2%, the reset current of the non-volatile memory device is 0.9 mA. The reset current is the current required to change the crystalline state of a phase-change material to the amorphous state. Thus, the lower the reset current, the less the power consumption. Further, a low reset current may be advantageous in multi-level cell applications. Although not shown in FIG. 8A, the reset current of a non-volatile memory device using a Se—Ge—Sb—Te phase-change material according to embodiments of the inventive concepts decreases as the content of Se increases. In particular, if the content of Se is 15%, the reset current of the non-volatile memory device may be minimized.

Figure 8B:
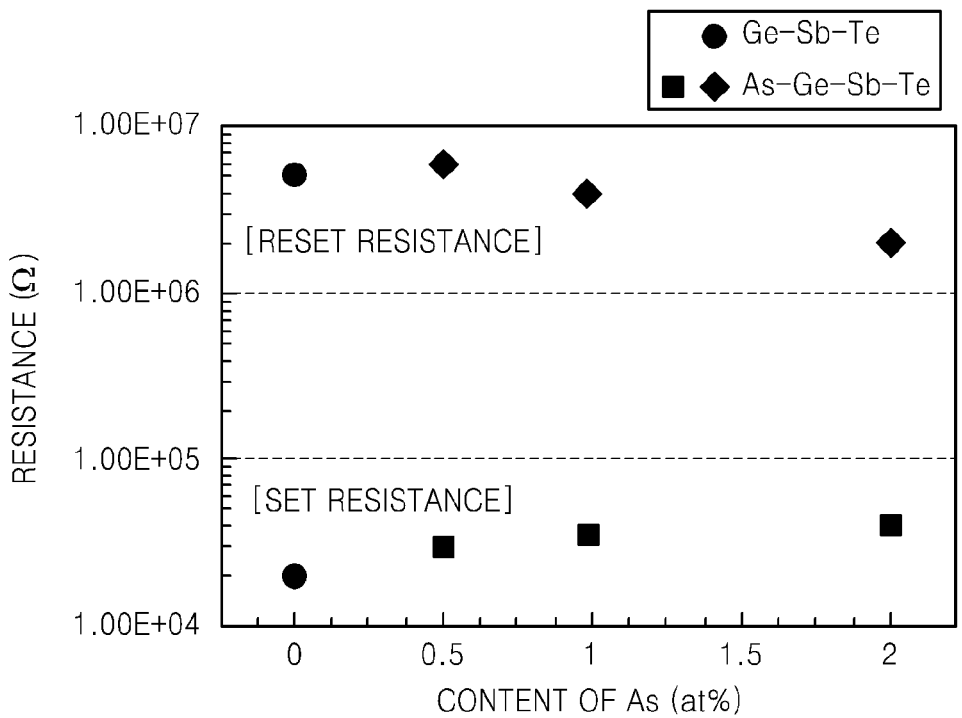

FIG. 8B illustrates set and reset resistances (ohms) of a conventional non-volatile memory include a Ge—Sb—Te phase change material (0 at % of As), and set and reset resistances of As—Ge—Sb—Te phase change materials (0.5%, 1% and 2% of As) according to non-volatile memory devices of embodiments of the inventive concepts. As shown in the figure, compared with the conventional non-volatile memory device including the Ge—Sb—Te phase-change material, a non-volatile memory device using an As—Ge—Sb—Te phase-change material according to embodiments of the inventive concepts exhibit a reset resistance and a set resistance that decrease and increase, respectively, as the content of As increases. Thus, an interval between the reset resistance and the set resistance is decreased.

Figure 8C:
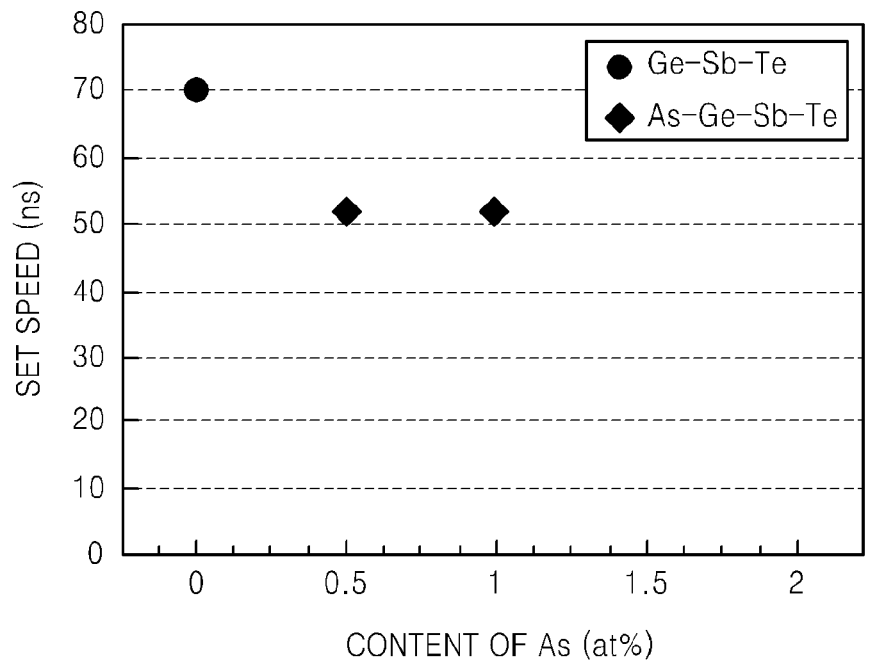

FIG. 8C illustrates set speeds (ns) of a conventional non-volatile memory include a Ge—Sb—Te phase change material (0 at % of As), and set speeds (ns) of As—Ge—Sb—Te phase change materials (0.5% and 1% of As) according to non-volatile memory devices of embodiments of the inventive concepts. As shown in the figure, the conventional non-volatile memory device including the Ge—Sb—Te phase-change material has a set speed of about 70 ns (nano second), whereas non-volatile memory devices having As—Ge—Sb—Te phase-change materials have set speeds of about 30 ns. The lower set speeds of the Ge—Sb—Te phase-change material including As means a relatively fast change into a set state (that is, a crystalline state), thereby increasing an operating speed of the non-volatile memory devices.

Figure 8D:
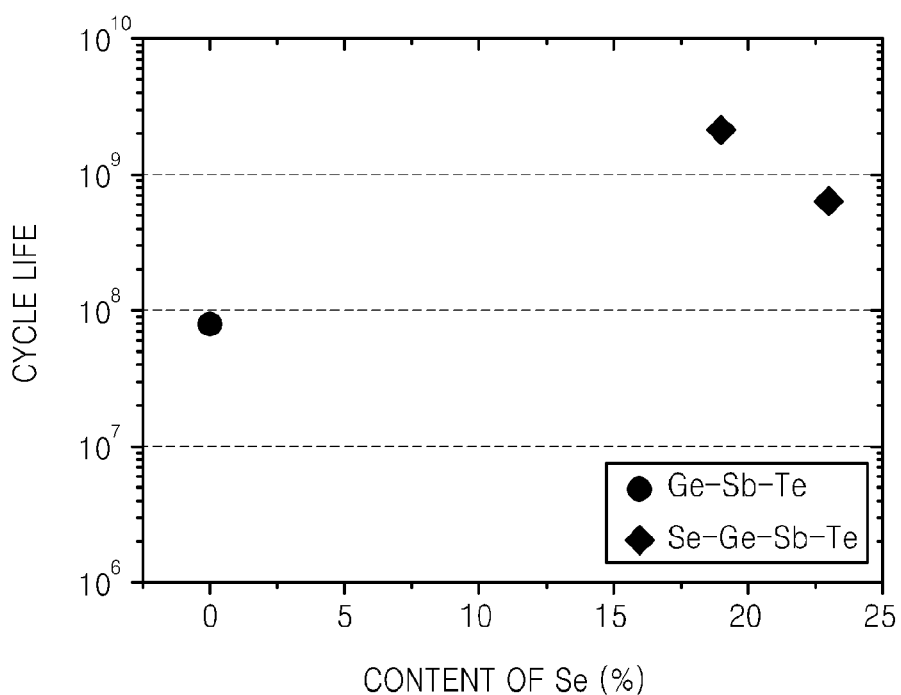

FIG. 8D illustrates a cycle life of a conventional non-volatile memory include a Ge—Sb—Te phase change material (0 at % of Se), and cycle lifes of As—Ge—Sb—Te phase change materials (18 at % and 23 at % of Se) according to non-volatile memory devices of embodiments of the inventive concepts. As shown in the figure, the conventional non-volatile memory device including the Ge—Sb—Te phase-change material has a cycle life of about $10^8$, whereas non-volatile memory devices having Se—Ge—Sb—Te phase-change materials respectively have a cycle life of about $2\times10^9$ and a cycle life of about $6\times10^8$, thereby enhancing the life span of the non-volatile memory. This life span also increases in the case of the As—Ge—Sb—Te phase-change materials.

Figure 9:
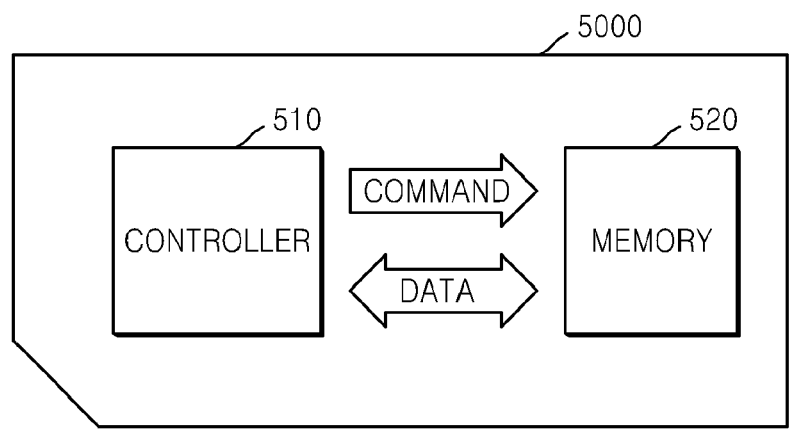
FIG. 9 is a schematic diagram of a memory card incorporating embodiments of the inventive concepts.

FIG. 9 is a schematic view illustrating an embodiment of a memory card 5000 adopting aspects of the inventive concepts.

Referring to FIG. 9, a controller 510 and a memory 520 are disposed to send/receive electric signals to/from each other. For example, when the controller 510 gives a command to the memory 520, the memory 520 can send data. The memory 520 includes a non-volatile memory device having a phase change material according to one or more embodiments of the inventive concepts. The non-volatile memory devices according to the various embodiments of the inventive concept can be disposed in various architecture arrays in correspondence to the logic gate design. The memory arrays disposed in a plurality of rows and columns can have one or more memory array banks (not shown). The memory 520 can include a memory array (not shown) or a memory array bank (not shown), all of which are known in the art. The memory card 5000 can further include conventional members, such as a conventional row decoder (not shown), a column decoder (not shown), input/output (I/O) buffers (now shown), and/or a control resistor (not shown) in order to drive the memory array bank (not shown), all of which are known in the art. The memory card 5000 can be used in memory devices as a memory card, for example, such as a memory stick card, a smart media (SM) card, a secure digital (SD) card, a mini SD card, or a multi media card (MMC).

Figure 10:
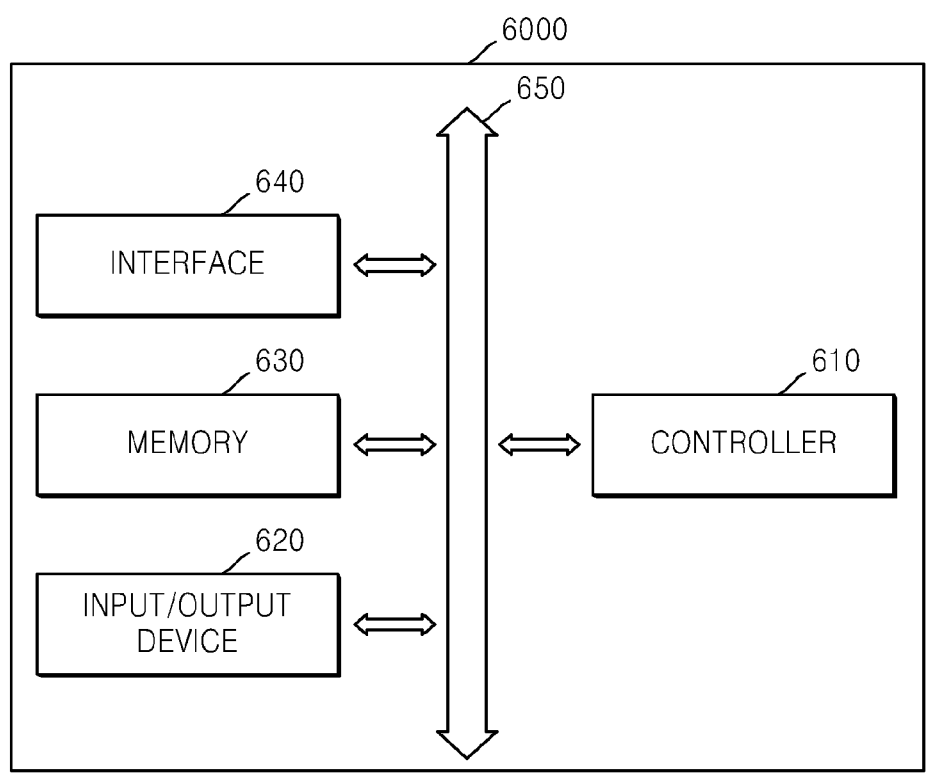
FIG. 10 is a schematic diagram of a system incorporating embodiments of the inventive concepts.

FIG. 10 is a schematic diagram of a system 6000 adopting a non-volatile memory device according to one or more embodiments of the inventive concepts.

Referring to FIG. 10, the system 6000 may include a controller 610, an input/output device 620, a memory 630, and an interface 640. The system 6000 may be a mobile system or a system that transmits or receives data. The mobile system may be a personal digital assistant (PDA), a portable computer, a web tablet, a wireless phone, a mobile phone, a digital music player, or a memory card. The controller 610 executes a software program and controls the system 6000. The controller 610 may be a microprocessor, a digital signal processor, a microcontroller, or the like. The input/output device 630 can be used to input or output data of the system 6000. The system 6000 is connected to an external apparatus, for example, a personal computer or a network, using the input/output device 620, to send/receive data to/from the external apparatus. The input/output device 620 may be a keypad, a keyboard, or a display. The memory 630 may store codes and/or data for operating the controller 610 and/or may store data processed by the controller 610. The memory 630 include a non-volatile memory device according to an embodiments of the inventive concepts. The interface 640 may be a data transmission path between the system 6000 and an external apparatus. The controller 610, the input/output device 620, the memory 630, and the interface 640 may communicate with one another by a bus 650. For example, the system 6000 can be used for a mobile phone, a MP3 player, a navigation system, a portable multimedia player (PMP), a solid state disk (SSD), or a household appliance.

The foregoing is illustrative of exemplary embodiments and is not to be construed as limiting thereof. Although exemplary embodiments have been described, those of ordinary skill in the art will readily appreciate that many modifications are possible in the exemplary embodiments without materially departing from the novel teachings and advantages of the exemplary embodiments. Accordingly, all such modifications are intended to be included within the scope of the claims. Exemplary embodiments are defined by the following claims, with equivalents of the claims to be included therein.

What is claimed is:

1. A non-volatile memory device comprising:
a lower electrode;
a phase-change material layer formed on the lower electrode so as to be electrically connected to the lower electrode; and
an upper electrode formed on the phase-change material layer so as to be electrically connected to the phase-change material layer;
wherein the phase-change material layer comprises a phase-change material comprising a composition represented by the formula $(I)_A(II_X III_Y IV_Z)_{(1-A)}$,
where I is at least one of As and Se, II is at least one of Ge, Si and Sn, III is at least one of Sb and Bi, and IV is at least one of Te and Se, and
where $0.001 \leq A \leq 0.3$, $0.001 \leq X \leq 0.3$, $0.001 \leq Y \leq 0.8$, $0.1 \leq Z \leq 0.8$, and $X+Y+Z=1$,
wherein the phase-change material comprises a composition represented by Formula 2:

$$(As_C Se_{(1-C)})_A (Ge_X Sb_Y Te_Z)_{(1-A)} \qquad \text{Formula 2}$$

where $0 \leq C \leq 1$.

2. The non-volatile memory device of claim 1, wherein the phase-change material layer is doped with at least one selected from the group consisting of C, N, Si, O, Bi, and Sn.

3. A system comprising the non-volatile memory device of claim 1, and further comprising a processor and a data bus for exchanging data between the non-volatile memory device and the processor.

4. A non-volatile memory device comprising:
a lower electrode;
a phase-change material layer formed on the lower electrode so as to be electrically connected to the lower electrode; and
an upper electrode formed on the phase-change material layer so as to be electrically connected to the phase-change material layer;
wherein the phase-change material layer comprises a phase-change material comprising a composition represented by the formula $(I)_A(II_X III_Y IV_Z)_{(1-A)}$,
where I is at least one of As and Se, II is at least one of Ge, Si and Sn, III is at least one of Sb and Bi, and IV is at least one of Te and Se, and
where $0.001 \leq A \leq 0.3$, $0.001 \leq X \leq 0.3$, $0.001 \leq Y \leq 0.8$, $0.1 \leq Z \leq 0.8$, and $X+Y+Z=1$,
wherein the phase-change material comprises a composition represented by Formula 3:

$$(As)_A((Ge_U Q_{(1-U)})_X Sb_Y Te_Z)_{(1-A)} \qquad \text{Formula 3}$$

where Q is Si or Sn, and $0 \leq U \leq 1$.

5. A non-volatile memory device comprising:
a lower electrode;
a phase-change material layer formed on the lower electrode so as to be electrically connected to the lower electrode; and an upper electrode formed on the phase-change material layer so as to be electrically connected to the phase-change material layer;

wherein the phase-change material layer comprises a phase-change material comprising a composition represented by the formula $(I)_A(II_X III_Y IV_Z)_{(1-A)}$, where I is at least one of As and Se, II is at least one of Ge, Si and Sn, III is at least one of Sb and Bi, and IV is at least one of Te and Se, and where $0.001 \leq A \leq 0.3$, $0.001 \leq X \leq 0.3$, $0.001 \leq Y \leq 0.8$, $0.1 \leq Z \leq 0.8$, and $X+Y+Z=1$, wherein the phase-change material comprises a composition represented by Formula 4:

$$(As)_A(Ge_X((Sb_V Bi_{(1-V)})_Y Te_Z)_{(1-A)} \qquad \text{Formula 4}$$

where $0 \leq V \leq 1$.

6. A non-volatile memory device comprising:

a lower electrode;

a phase-change material layer formed on the lower electrode so as to be electrically connected to the lower electrode; and an upper electrode formed on the phase-change material layer so as to be electrically connected to the phase-change material layer;

wherein the phase-change material layer comprises a phase-change material comprising a composition represented by the formula $(I)_A(II_X III_Y IV_Z)_{(1-A)}$, where I is at least one of As and Se, II is at least one of Ge, Si and Sn, III is at least one of Sb and Bi, and IV is at least one of Te and Se, and where $0.001 \leq A \leq 0.3$, $0.001 \leq X \leq 0.3$, $0.001 \leq Y \leq 0.8$, $0.1 \leq Z \leq 0.8$, and $X+Y+Z=1$, wherein the phase-change material comprises a composition represented by Formula 5:

$$(As)_A(Ge_X Sb_Y(Te_W Se_{(1-W)})_Z)_{(1-A)} \qquad \text{Formula 5}$$

where $0 \leq W \leq 1$.

7. A non-volatile memory device comprising:

a lower electrode;

a phase-change material layer formed on the lower electrode so as to be electrically connected to the lower electrode; and an upper electrode formed on the phase-change material layer so as to be electrically connected to the phase-change material layer;

wherein the phase-change material layer comprises a phase-change material comprising a composition represented by the formula $(I)_A(II_X III_Y IV_Z)_{(1-A)}$, where I is at least one of As and Se, II is at least one of Ge, Si and Sn, III is at least one of Sb and Bi, and IV is at least one of Te and Se, and where $0.001 \leq A \leq 0.3$, $0.001 \leq X \leq 0.3$, $0.001 \leq Y \leq 0.8$, $0.1 \leq Z \leq 0.8$, and $X+Y+Z=1$, wherein the phase-change material comprises a composition represented by Formula 6:

$$(As)_A((Ge_U Q_{(1-U)})_X(Sb_V Bi_{(1-V)})_Y Te_Z)_{(1-A)} \qquad \text{Formula 6}$$

where Q is Si or Sn, $0 \leq U \leq 1$, and $0 \leq V \leq 1$.

8. A non-volatile memory device comprising:

a lower electrode;

a phase-change material layer formed on the lower electrode so as to be electrically connected to the lower electrode; and an upper electrode formed on the phase-change material layer so as to be electrically connected to the phase-change material layer;

wherein the phase-change material layer comprises a phase-change material comprising a composition represented by the formula $(I)_A(II_X III_Y IV_Z)_{(1-A)}$, where I is at least one of As and Se, II is at least one of Ge, Si and Sn, III is at least one of Sb and Bi, and IV is at least one of Te and Se, and where $0.001 \leq A \leq 0.3$, $0.001 \leq X \leq 0.3$, $0.001 \leq Y \leq 0.8$, $0.1 \leq Z \leq 0.8$, and $X+Y+Z=1$, wherein the phase-change material comprises a composition represented by Formula 7:

$$(As)_A(Ge_X(Sb_V Bi_{(1-V)})_Y(Te_W Se_{(1-W)})_Z)_{(1-A)} \qquad \text{Formula 7}$$

where $0 \leq V \leq 1$, and $0 \leq W \leq 1$.

9. A non-volatile memory device comprising:

a lower electrode;

a phase-change material layer formed on the lower electrode so as to be electrically connected to the lower electrode; and an upper electrode formed on the phase-change material layer so as to be electrically connected to the phase-change material layer;

wherein the phase-change material layer comprises a phase-change material comprising a composition represented by the formula $(I)_A(II_X III_Y IV_Z)_{(1-A)}$, where I is at least one of As and Se, II is at least one of Ge, Si and Sn, III is at least one of Sb and Bi, and IV is at least one of Te and Se, and where $0.001 \leq A \leq 0.3$, $0.001 \leq X \leq 0.3$, $0.001 \leq Y \leq 0.8$, $0.1 \leq Z \leq 0.8$, and $X+Y+Z=1$, wherein the phase-change material comprises a composition represented by Formula 8:

$$(As)_A((Ge_U Q_{(1-U)})_X Sb_Y(Te_W Se_{(1-W)})_Z)_{(1-A)} \qquad \text{Formula 8}$$

where Q is Si or Sn, $0 \leq U \leq 1$, and $0 \leq W \leq 1$.

10. The non-volatile memory device of claim 1, further comprising a memory controller, wherein the memory controller, the lower electrode, the phase-change material layer and the upper electrode are contained in a memory card.

11. A non-volatile memory device comprising:

a lower electrode;

a phase-change material layer formed on the lower electrode so as to be electrically connected to the lower electrode; and an upper electrode formed on the phase-change material layer so as to be electrically connected to the phase-change material layer;

wherein the phase-change material layer comprises a phase-change material comprising a composition represented by the formula $(M)_B(I)_A(II_X III_Y IV_Z)_{(1-A-B)}$, where M is a metal, I is at least one of As and Se, II is at least one of Ge, Si and Sn, III is at least one of Sb and Bi, and IV is at least one of Te and Se, and where $0.001 \leq A \leq 0.3$, $0.001 \leq B \leq 0.3$, $0.001 \leq X \leq 0.3$, $0.001 \leq Y \leq 0.8$, $0.1 \leq Z \leq 0.8$, and $X+Y+Z=1$.

12. The non-volatile memory device of claim 11, wherein the phase-change material comprises a composition represented by Formula 9:

$$(M)_B(As)_A(Ge_X Sb_Y Te_Z)_{(1-A)}. \qquad \text{Formula 9}$$

13. The non-volatile memory device of claim 11, wherein the metal comprises at least one selected from the group consisting of aluminum (Al), gallium (Ga), zinc (Zn), titanium (Ti), chromium (Cr), manganese (Mn), iron (Fe), cobalt (Co), nickel (Ni), molybdenum (Mo), ruthenium (Ru), palladium (Pd), hafnium (Hf), tantalum (Ta), iridium (Ir), platinum (Pt), zirconium (Zr), thallium (Tl), palladium (Pd), and polonium (Po).

14. The non-volatile memory device of claim 11, wherein the phase-change material layer is doped with at least one selected from the group consisting of C, N, Si, O, Bi, and Sn.

15. The non-volatile memory device of claim 11, further comprising a memory controller, wherein the memory controller, the lower electrode, the phase-change material layer and the upper electrode are contained in a memory card.

16. A system comprising the non-volatile memory device of claim 11, and further comprising a processor and a data bus for exchanging data between the non-volatile memory device and the processor.

* * * * *